(12) United States Patent
Peng et al.

(10) Patent No.: US 8,971,824 B2
(45) Date of Patent: Mar. 3, 2015

(54) RADIO FREQUENCY UNIT AND INTEGRATED ANTENNA

(75) Inventors: Yonghui Peng, Shenzhen (CN);
Shengjun Ou, Bridgewater, NJ (US);
Tao Tang, Shenzhen (CN); Ganghua Yang, Shanghai (CN); Tengyue Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 311 days.

(21) Appl. No.: 13/231,680

(22) Filed: Sep. 13, 2011

(65) Prior Publication Data
US 2012/0001809 A1   Jan. 5, 2012

Related U.S. Application Data

(63) Continuation of application No. PCT/CN2009/070783, filed on Mar. 13, 2009.

(51) Int. Cl.
*H04W 88/02* (2009.01)
*H01Q 23/00* (2006.01)
*H01Q 1/02* (2006.01)
*H04B 1/03* (2006.01)
*H04B 1/40* (2006.01)
(Continued)

(52) U.S. Cl.
CPC ............... *H01Q 23/00* (2013.01); *H01Q 1/02* (2013.01); *H04B 1/03* (2013.01); *H04B 1/40* (2013.01); *H05K 7/20409* (2013.01); *H05K 1/145* (2013.01)
USPC .............. 455/73; 343/702; 361/709; 361/807

(58) Field of Classification Search
CPC ...... H04B 1/40; H01Q 1/243; H01L 23/4093; H05K 7/142
USPC ........................................................... 455/73
See application file for complete search history.

(56) References Cited

U.S. PATENT DOCUMENTS 4,792,939 A * 12/1988 Hikita et al. .................. 370/277
5,740,522 A * 4/1998 Dolman et al. ............... 455/113
(Continued)

FOREIGN PATENT DOCUMENTS

CN           1684259 A      10/2005
CN           1825687 A       8/2006
(Continued)

OTHER PUBLICATIONS

Extended European Search Report issued in corresponding European Patent Application No. 09841323.0, mailed Feb. 14, 2012.
(Continued)

*Primary Examiner* — Hai V Nguyen
(74) *Attorney, Agent, or Firm* — Brinks Gilson & Lione

(57) ABSTRACT

A radio frequency unit and an integrated antenna are provided. The radio frequency unit includes a duplexer, a power amplifier circuit board, and a transceiver circuit board. The duplexer connects to the power amplifier circuit board and the transceiver circuit board. The power amplifier circuit board connects to the transceiver circuit board. The power amplifier circuit board and the transceiver circuit board are respectively located at two end portions of the duplexer. The power amplifier circuit board and the transceiver circuit board are projected onto the same plane along a direction being vertical to the power amplifier circuit board with their projections on the same plane non-overlapped each other.

20 Claims, 6 Drawing Sheets

(51) Int. Cl.
*H05K 7/20* (2006.01)
*H05K 1/14* (2006.01)

(56) References Cited

U.S. PATENT DOCUMENTS

| | | | |
|---|---|---|---|
| 5,986,618 A | 11/1999 | Aakula et al. | |
| 6,084,772 A * | 7/2000 | Pell et al. | 361/699 |
| 6,091,715 A * | 7/2000 | Vucetic et al. | 370/277 |
| 6,108,313 A * | 8/2000 | Lee et al. | 370/294 |
| 6,219,562 B1 * | 4/2001 | Williams | 455/561 |
| 6,370,386 B1 * | 4/2002 | Williams | 455/452.1 |
| 6,462,620 B1 * | 10/2002 | Dupuis et al. | 330/264 |
| 6,574,476 B1 * | 6/2003 | Williams | 455/452.1 |
| 6,649,998 B2 * | 11/2003 | Song | 257/532 |
| 6,982,879 B1 * | 1/2006 | Franca-Neto et al. | 361/803 |
| 7,120,427 B1 * | 10/2006 | Adams et al. | 455/418 |
| 7,366,553 B1 | 4/2008 | Shields et al. | |
| 7,457,617 B2 * | 11/2008 | Adams et al. | 455/418 |
| 7,599,667 B2 * | 10/2009 | Arai | 455/78 |
| 8,023,999 B2 * | 9/2011 | Fischer | 455/561 |
| 8,155,663 B2 * | 4/2012 | Wilson et al. | 455/456.1 |
| 8,279,018 B1 * | 10/2012 | Song et al. | 333/25 |
| 8,301,077 B2 * | 10/2012 | Xue et al. | 455/7 |
| 8,606,193 B2 * | 12/2013 | Ko et al. | 455/73 |
| 8,625,472 B2 * | 1/2014 | Fan | 370/280 |
| 8,630,658 B2 * | 1/2014 | Wilson et al. | 455/456.1 |
| 8,633,393 B2 * | 1/2014 | Yang et al. | 174/252 |
| 8,655,301 B2 * | 2/2014 | Roussel et al. | 455/307 |
| 8,660,041 B2 * | 2/2014 | Niskanen et al. | 370/278 |
| 8,781,409 B2 * | 7/2014 | Peng et al. | 455/90.3 |
| 8,830,881 B2 * | 9/2014 | Mikhemar et al. | 370/278 |
| 2005/0230682 A1 | 10/2005 | Hara | |
| 2007/0004372 A1 * | 1/2007 | Adams et al. | 455/333 |
| 2008/0161055 A1 * | 7/2008 | Fischer | 455/561 |
| 2009/0163152 A1 * | 6/2009 | Jiang | 455/90.2 |
| 2010/0073896 A1 * | 3/2010 | Tang et al. | 361/803 |
| 2010/0238635 A1 * | 9/2010 | Yang et al. | 361/748 |
| 2012/0001809 A1 | 1/2012 | Peng et al. | |
| 2012/0044840 A1 * | 2/2012 | Peng et al. | 370/277 |
| 2014/0327578 A1 * | 11/2014 | Rowson et al. | 342/368 |

FOREIGN PATENT DOCUMENTS

| | | | | |
|---|---|---|---|---|
| CN | 101106235 A | * | 1/2008 | |
| CN | 201038329 Y | * | 3/2008 | |
| GB | 2289827 A | | 11/1995 | |
| JP | 05-183328 | | 7/1993 | |
| JP | 08037414 A | * | 2/1996 | |
| KR | 20030091157 A | | 12/2003 | |
| KR | 20080006414 A | | 1/2008 | |
| KR | 2008-0018758 A | * | 2/2008 | |
| KR | 20080018758 A | | 2/2008 | |
| KR | 20080018758 A | * | 8/2008 | |
| WO | WO2008156760 A1 | | 12/2008 | |

OTHER PUBLICATIONS

Office Action issued in commonly owned U.S. Appl. No. 13/287,773, mailed Apr. 26, 2012.

Office Action issued in corresponding Chinese Patent Application No. 200980156435.2, mailed May 10, 2013, 15 pages.

Office Action (including English translation) issued in corresponding Japanese Patent Application No. 2011-553252; mailed Jul. 2, 2013.

Written Opinion of the International Searching Authority issued in corresponding PCT Patent Application No. PCT/CN2009/070783, mailed Dec. 24, 2009.

International Search Report issued in corresponding PCT Patent Application No. PCT/CN2009/070783, mailed Dec. 24, 2009.

Office Action issued in corresponding Chinese Patent Application No. 200980156435.2, mailed Jan. 15, 2013.

Office Action issued in commonly owned U.S. Appl. No. 13/287,773, mailed Oct. 10, 2013, 6 pages.

* cited by examiner

RADIO FREQUENCY UNIT AND INTEGRATED ANTENNA

CROSS-REFERENCE TO RELATED APPLICATIONS

This application is a continuation of International Application No. PCT/CN2009/070783, filed on 13 Mar. 2009, which is hereby incorporated by reference in their entireties.

FIELD OF THE INVENTION

The present invention relates to the field of communication technology, and in particular, to a radio frequency unit and an integrated antenna.

BACKGROUND OF THE INVENTION

With the development of the radio communication technology, more and more base stations are developed towards miniaturization and integration. Meanwhile, people expect the base station to be increasingly small and light on the entire architecture thereof and continuous improvement on performance. Thus, as the base station is developed towards miniaturization, how to enable a radio frequency unit integrated with an antenna to meet heat dissipation demands becomes an urgent problem in the industry.

As shown in FIG. 1, it is a schematic structural view of a radio frequency unit in the related art. The radio frequency unit 100 includes a duplexer 10, a power amplifier circuit board 30, and a transceiver circuit board 50. The duplexer 10 connects to the power amplifier circuit board 30 and the transceiver circuit board 50, and the power amplifier circuit board 30 connects the transceiver circuit board 50, where the power amplifier circuit board 30 is opposite to the transceiver circuit board 50. The radio frequency unit 100 further includes a first case 71 and a second case 73, the first case 71 and the second case 73 may defines a sealed cavity in which the power amplifier circuit board 30 and the transceiver circuit board 50 are located. Heat sink teeth are positioned at the first case 71 and the second case 73 to dissipate heat generated by the power amplifier circuit board 30 and the transceiver circuit board 50.

Usually the radio frequency unit 100 is integrated with an antenna. When transmitting a signal, transmission equipment transmits a digital signal to a baseband processing unit through an optical fiber or a cable, the baseband processing unit converts the digital signal to an analogue signal, the analogue signal is processed to a radio frequency small signal through the transceiver circuit board 50, the radio frequency small signal is amplified to a large power radio frequency signal through the power amplifier circuit board 30, and then the large power radio frequency signal is filtered through the duplexer 10, and transmitted to the antenna, so that the antenna may convert the radio frequency signal to an electromagnetic wave and radiates the electromagnetic wave. When receiving a signal, the antenna receives an electromagnetic wave from a terminal, converts the electromagnetic wave to a radio frequency signal, the radio frequency signal is filtered through the duplexer 10 and transmitted to the transceiver circuit board 50, the transceiver circuit board 50 processes the signal to an analogue signal and transmits the analogue signal to the baseband processing unit, and the baseband processing unit processes the analogue signal to a digital signal and transmits the digital signal to the transmission equipment.

When the radio frequency unit 100 works, the power amplifier circuit board 30 and the transceiver circuit board 50 generate heat, and the power amplifier circuit board 30 is opposite to the transceiver circuit board 50. As a result, the heat generated by the power amplifier circuit board 30 may affect the transceiver circuit board 50, and heat dissipation efficiency of the radio frequency unit 100.

SUMMARY OF THE INVENTION

The present invention is directed to a radio frequency unit and an integrated antenna, capable of improving heat dissipation efficiency of the radio frequency unit.

An embodiment of the present invention provides a radio frequency unit, which includes a duplexer, a power amplifier circuit board, and a transceiver circuit board. The duplexer connects to the power amplifier circuit board and the transceiver circuit board. The power amplifier circuit board connects to the transceiver circuit board. The power amplifier circuit board and the transceiver circuit board are respectively located at two end portions of the duplexer. The power amplifier circuit board and the transceiver circuit board are projected onto the same plane along a direction being vertical to the power amplifier circuit board with their projections on the same plane non-overlapped each other.

An embodiment of the present invention further provides an integrated antenna, which includes an antenna unit and a radio frequency unit. The radio frequency unit includes a duplexer, a power amplifier circuit board, and a transceiver circuit board. The duplexer connects to the power amplifier circuit board and the transceiver circuit board. The power amplifier circuit board connects to the transceiver circuit board. The power amplifier circuit board and the transceiver circuit board are respectively located at two end portions of the duplexer. The power amplifier circuit board and the transceiver circuit board are projected onto the same plane along a direction being vertical to the power amplifier circuit board with their projections on the same plane non-overlapped each other. The duplexer connects to a circuit board of the antenna unit through a coaxial connector.

It can be known from the above that the power amplifier circuit board and the transceiver circuit board are respectively located at the two end portions of the duplexer, and the power amplifier circuit board and the transceiver circuit board are projected onto the same plane along the direction being vertical to the power amplifier circuit board with their projections on the same plane non-overlapped each other, so that heat generated by the power amplifier circuit board hardly affects the transceiver circuit board, and by adopting the radio frequency unit with the layout, the heat dissipation efficiency of the radio frequency unit can be improved.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Obviously, the accompanying drawings in the following description are only some embodiments of the present invention; and persons of ordinary skill in the art can obtain other drawings according to the accompanying drawings without any creative efforts.

DETAILED DESCRIPTION OF THE EMBODIMENTS

The technical solutions of the exemplary embodiments of the present invention will be clearly and fully described in the following with reference to the accompanying drawings. It is obvious that the embodiments to be described are only a part rather than all of the embodiments of the present invention. All other embodiments derived by persons skilled in the related art based on the embodiments of the present invention without carrying out creative activities should fall within the protection scope of the present invention.

Figure 1:
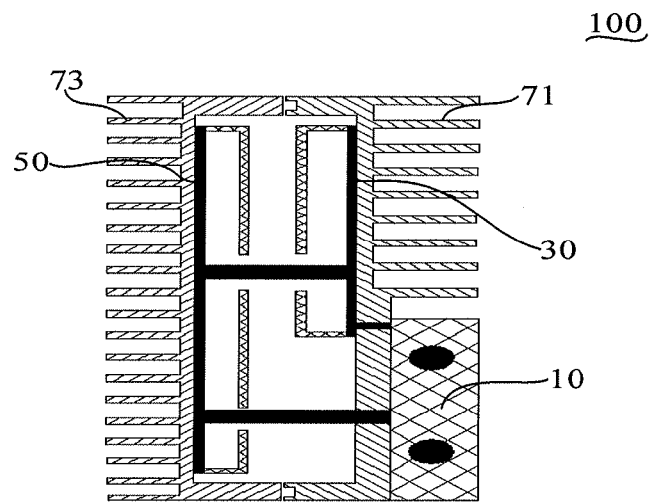
FIG. 1 is a schematic structural view of a radio frequency unit in the prior art.
Figure 2:
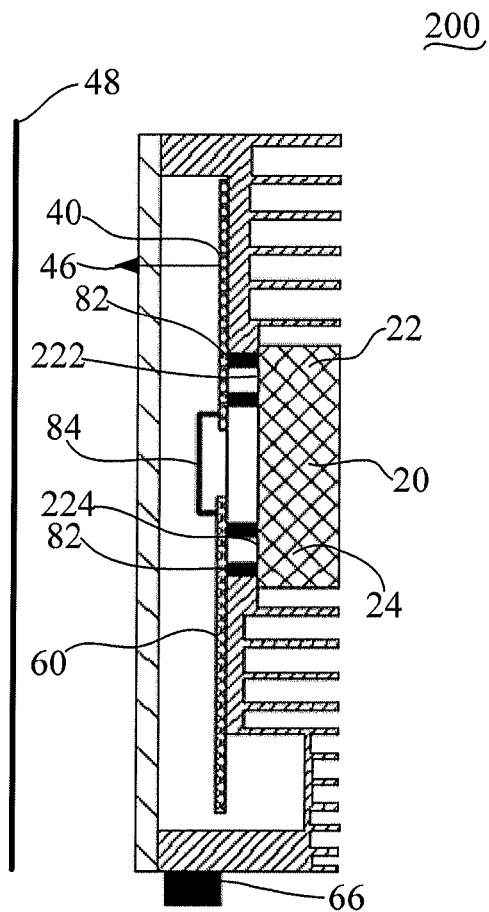
FIG. 2 is a schematic structural view of a radio frequency unit according to an embodiment of the present invention.

Referring to FIG. 2, it is a schematic structural view of a radio frequency unit according to an embodiment of the present invention. The radio frequency unit 200 according to the embodiment of the present invention includes a duplexer 20, a power amplifier circuit board 40, and a transceiver circuit board 60. The duplexer 20 connects to the power amplifier circuit board 40 and the transceiver circuit board 60. The power amplifier circuit board 40 connects to the transceiver circuit board 60. The power amplifier circuit board 40 and the transceiver circuit board 60 are respectively located at two end portions of the duplexer 20. The power amplifier circuit board 40 and the transceiver circuit board 60 are projected onto the same plane along a direction being vertical to the power amplifier circuit board 40 with their projections on the same plane non-overlapped each other.

It can be known from the above that when the radio frequency unit 200 according to the embodiment of the present invention works, the power amplifier circuit board 40 and the transceiver circuit board 60 are respectively located at the two end portions of the duplexer 20, and the power amplifier circuit board 40 and the transceiver circuit board 60 are projected onto the same plane along the direction being vertical to the power amplifier circuit board 40 with their projections on the same plane non-overlapped each other, so that heat generated by the power amplifier circuit board 40 hardly affects the transceiver circuit board 60, and by adopting the radio frequency unit 200 with the layout, heat dissipation efficiency of the radio frequency unit 200 can be improved.

Still referring to FIG. 2, the direction being vertical to the power amplifier circuit board 40 is shown by an arrow 46 in FIG. 2, and a plane being vertical to the direction of the arrow is a plane 48. The power amplifier circuit board 40 and the transceiver circuit board 60 are respectively projected onto the plane 48, and the projection formed by the power amplifier circuit board 40 and the projection formed by the transceiver circuit board 60 on the plane 48 are not overlapped.

Heat sink teeth are positioned at a side of the power amplifier circuit board 40, and heat sink teeth are positioned at a side of the transceiver circuit board 60. When the radio frequency unit 200 works, the heat generated by the power amplifier circuit board 40 and the transceiver circuit board 60 can be dissipated through the heat sink teeth.

Referring to FIG. 2, the power amplifier circuit board 40 and the transceiver circuit board are located in the same plane. It should be noted that the power amplifier circuit board 40 and the transceiver circuit board are located in the same plane, which is not necessarily the same plane in the scope of strict geometrical meaning and may have a certain error being approximately 10% or 15% in flatness, as long as the heat dissipation efficiency of the radio frequency unit can be improved. Definitely, the same plane may be considered the same plane in the scope of strict geometrical meaning.

The radio frequency unit 200 further includes a baseband processing unit and a hybrid connector 66, the transceiver circuit board 60 connects to the baseband processing unit, and the baseband processing unit connects to transmission equipment and power equipment through a hybrid connector 66. The power equipment supplies power for the power amplifier circuit board 40, the transceiver circuit board 60, and the baseband processing unit.

The radio frequency unit 200 further includes a hybrid connector 66, and the transceiver circuit board 60 connects to the baseband processing unit and the power equipment through the hybrid connector 66. The power equipment supplies power for the power amplifier circuit board 40, the transceiver circuit board 60, and the baseband processing unit.

Further, the transmission equipment may be optical network transmission equipment or microwave transmission equipment.

Still referring to FIG. 2, the duplexer 20 includes two end portions, that is, a first end portion 22 and a second end portion 24, where the first end portion 22 may be opposite to the second end portion 24. The power amplifier circuit board 40 is located at the first end portion 22 of the duplexer 20, and the transceiver circuit board 60 is located at the second end portion 24 of the duplexer 20. It may be understood that the power amplifier circuit board 40 may also be located at the second end portion 24 of the duplexer 20, and the transceiver circuit board 60 may also be located at the first end portion of the duplexer 20.

In the following, a case that the power amplifier circuit board 40 is located at the first end portion 22 of the duplexer 20 and the transceiver circuit board 60 is located at the second end portion 24 of the duplexer 20 is taken as an example for illustration.

Referring to FIG. 2, the power amplifier circuit board 40 is located at the first end portion 22 of the duplexer 20, and specifically, the power amplifier circuit board 40 is located at one end of the duplexer 20, and the power amplifier circuit board 40 is located at one side 222 of the end; similarly, the transceiver circuit board 60 is located at the second end portion 24 of the duplexer 20, and specifically, the transceiver circuit board 60 is located at the other end of the duplexer 20, and the transceiver circuit board 60 is located at one side 224 of the other end. The side 222 of one end of the duplexer 20 and the side 224 of the other end of the duplexer 20 are the same side of the duplexer 20. It can be known from FIG. 2 that the power amplifier circuit board 40 and the transceiver circuit board 60 are located in the same plane.

Figure 3:
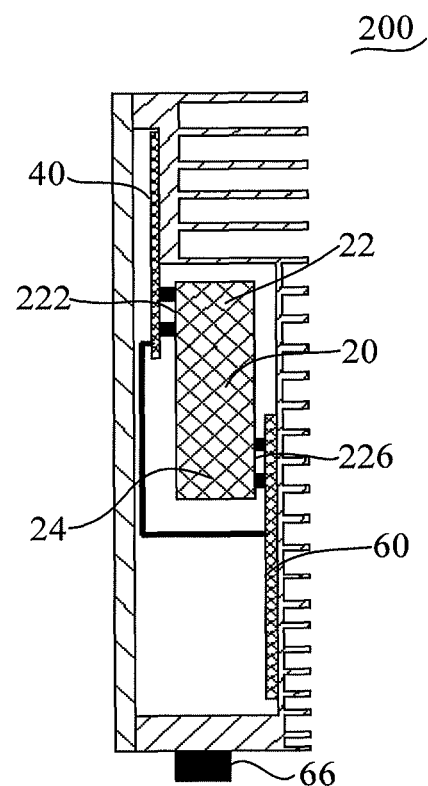
FIG. 3 is another schematic structural view of a radio frequency unit according to an embodiment of the present invention.

Referring to FIG. 3, the power amplifier circuit board 40 is located at the first end portion 22 of the duplexer 20, and specifically, the power amplifier circuit board 40 is located at one end of the duplexer 20, and the power amplifier circuit board 40 is located at one side 222 of the end; the transceiver circuit board 60 is located at the second end portion 24 of the duplexer 20, and specifically, the transceiver circuit board 60 is located at the other end of the duplexer 20, and the transceiver circuit board 60 is located at the other side 226 of the other end. It can be known from FIG. 3 that the side 222 of one end of the duplexer 20 and the other side 226 of the other end of the duplexer 20 are two different sides of the duplexer 20. The power amplifier circuit board 40 and the transceiver circuit board 60 are located at two sides of the duplexer 20.

Figure 4:
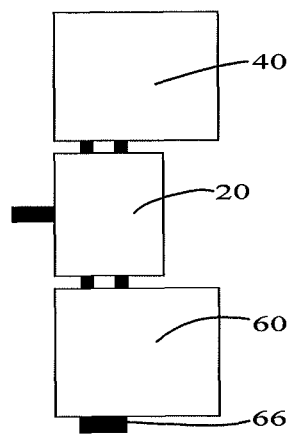
FIG. 4 is still another schematic structural view of a radio frequency unit according to an embodiment of the present invention.

Referring to FIG. 4, the power amplifier circuit board 40 is located at the first end portion 22 of the duplexer 20, and specifically, the power amplifier circuit board 40 is located at one end of the duplexer 20, and the power amplifier circuit board 40 is located above one end of the duplexer 20; the transceiver circuit board 60 is located at the second end portion 24 of the duplexer 20, and specifically, the transceiver circuit board 60 is located at the other end of the duplexer 20, and the transceiver circuit board 60 is located below the other end of the duplexer 20. Definitely, in the embodiment of the present invention, the power amplifier circuit board 40 may also be located below the other end of the duplexer 20, and the transceiver circuit board 60 may also be located above one end of the duplexer 20.

It should be noted that in the description of the embodiment, some terms are used for reference only without limitation. For example, the terms "one end" and "the other end" refer to the directions in the drawings used as reference. Unless otherwise stated explicitly herein, the terms "first", "second", and other ordinal numbers do not imply the sequence or order.

It should be understood that the power amplifier circuit board 40 and the transceiver circuit board 60 are respectively located at the two end portions of the duplexer 20, and specifically, the power amplifier circuit board 40 is located at one side of one end of the duplexer 20, and the transceiver circuit board 60 is located at one side of the other end of the duplexer 20; or the power amplifier circuit board 40 and the transceiver circuit board 60 are respectively located at two ends of the duplexer 20. Definitely, the power amplifier circuit board 40 and the transceiver circuit board 60 are respectively located at the two end portions of the duplexer 20, and specifically, the power amplifier circuit board 40 is located at one side of one end of the duplexer 20, and the transceiver circuit board 60 is located near below or above the other end of the duplexer.

Specifically, the power amplifier circuit board 40 is located at one side of one end of the duplexer 20, and the transceiver circuit board 60 is located near below or above the other end of the duplexer 20.

The power amplifier circuit board 40 is located at one side of one end of the duplexer 20, and the transceiver circuit board 60 is located below the other end of the duplexer 20; or the power amplifier circuit board 40 is located at one side of one end of the duplexer 20, and the transceiver circuit board 60 is located above the other end of the duplexer 20.

The duplexer 20 connects to the power amplifier circuit board 40, and specifically, the duplexer 20 is hard-connected with the power amplifier circuit board 40 through screws, is hard-connected with the power amplifier circuit board 40 through caps, connects to the power amplifier circuit board 40 through a radio frequency connector, connects to the power amplifier circuit board 40 through a coaxial cable, or connects to the power amplifier circuit board 40 through a blind-mating connector. Similarly, the duplexer 20 connects to the transceiver circuit board 60, and specifically, the duplexer 20 is hard-connected with the transceiver circuit board 60 through screws, is hard-connected with the transceiver circuit board 60 through caps, connects to the transceiver circuit board 60 through a radio frequency connector, connects to the transceiver circuit board 60 through a coaxial cable, or connects to the transceiver circuit board 60 through a blind-mating connector The power amplifier circuit board 40 connects to the transceiver circuit board 60, and specifically, the power amplifier circuit board 40 connects to the transceiver circuit board 60 through a hybrid connector, a radio frequency connector, or a coaxial cable.

Still referring to FIG. 2, the duplexer 20 connects to the power amplifier circuit board 40 and the transceiver circuit board 60 through blind-mating connectors 82; and the power amplifier circuit board 40 connects to the transceiver circuit board 60 through a coaxial cable 84.

Figure 5:
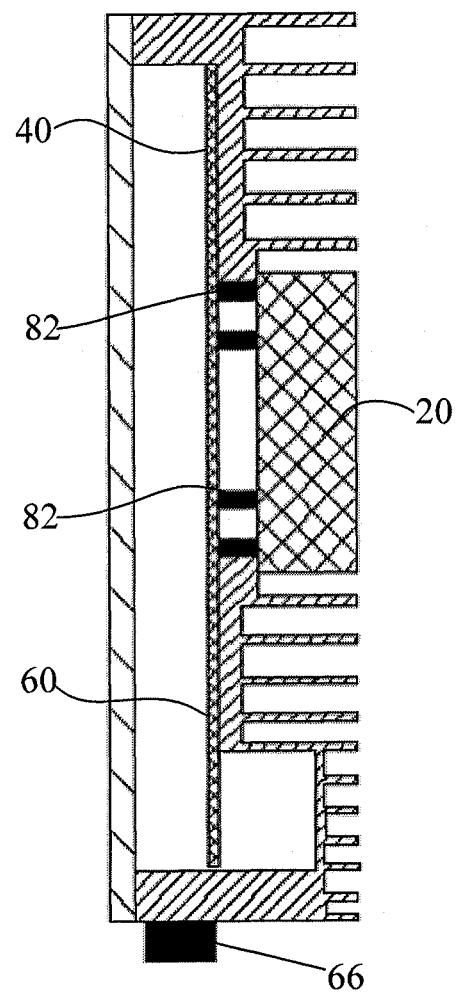
FIG. 5 is a schematic structural view in which a power amplifier circuit board and a radio frequency unit are formed on a common board according to an embodiment of the present invention.

It may be understood that in the embodiment of the radio frequency unit in FIG. 2, the power amplifier circuit board 40 connects to the transceiver circuit board 60 through the coaxial cable 84. Referring to FIG. 5, the power amplifier circuit board 40 and the transceiver circuit board 60 may be one circuit board, that is, the power amplifier circuit board 40 and the transceiver circuit board 60 are formed on a common board and the power amplifier circuit board 40 connects to the transceiver circuit board 60 through a circuit on the circuit board. The duplexer 20 may connect to the power amplifier circuit board 40 and the transceiver circuit board 60 through the blind-mating connectors 82.

Still referring to FIG. 5, it is a schematic structural view of a radio frequency unit according to an embodiment of the present invention. The radio frequency unit includes a duplexer 20, a power amplifier circuit 40, and a transceiver circuit 60, the duplexer 20 connects to the power amplifier circuit 40 and the transceiver circuit 60 respectively, the power amplifier circuit 40 connects to the transceiver circuit 60, and the power amplifier circuit 40 and the transceiver circuit 60 are located on the same circuit board.

The duplexer 20 is located at a center position of the circuit board.

It should be noted that the duplexer 20 is located at the center position of the circuit board, which is not necessarily the center position in the scope of geometrical meaning, and may have a certain error being approximately 10% or 15% in flatness. Definitely, the center position may be the center position in the scope of geometrical meaning.

It can be known from the above that when the radio frequency unit 200 according to the embodiment of the present invention works, the power amplifier circuit board 40 and the transceiver circuit board 60 are respectively located at two end portions of the duplexer 20, and the power amplifier circuit board 40 and the transceiver circuit board 60 are projected onto the same plane along the direction being vertical to the power amplifier circuit board 40 with their projections on the same plane non-overlapped each other, so that by adopting the radio frequency unit 200 with the layout, the heat dissipation efficiency of the radio frequency unit 200 can be improved.

Figure 6:
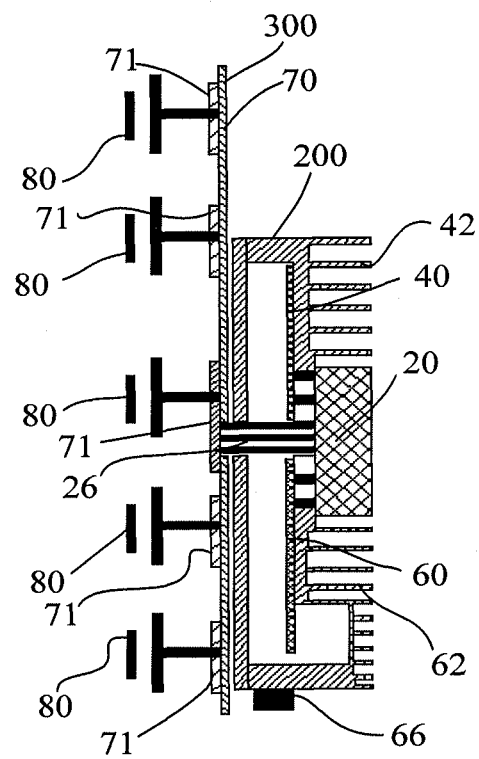
FIG. 6 is a schematic structural view of an integrated antenna according to an embodiment of the present invention.

Referring to FIG. 6, it is a schematic structural view of an integrated antenna according to an embodiment of the present invention. The integrated antenna includes an antenna unit 300 and a radio frequency unit 200. The radio frequency unit 200 includes a duplexer 20, a power amplifier circuit board 40, and a transceiver circuit board 60. The duplexer 20 connects to the power amplifier circuit board 40 and the transceiver circuit board 60. The power amplifier circuit board 40 connects to the transceiver circuit board 60. The power amplifier circuit board 40 and the transceiver circuit board 60 are respectively located at two end portions of the duplexer 20. The power amplifier circuit board 40 and the transceiver circuit board 60 are projected onto the same plane along a direction being vertical to the power amplifier circuit board 40 with their projections on the same plane non-overlapped each other. The duplexer 20 connects to a circuit board of the antenna unit 300 through a coaxial connector 26.

It can be known from the above that the power amplifier circuit board 40 and the transceiver circuit board 60 of the radio frequency unit 200 are respectively located at the two end portions of the duplexer 20, and the power amplifier circuit board 40 and the transceiver circuit board 60 are projected onto the same plane along the direction being vertical to the power amplifier circuit board 40 with their projections on the same plane non-overlapped each other, so that by adopting the radio frequency unit 200 with the layout, the heat dissipation efficiency of the radio frequency unit 200 can be improved.

Further, the duplexer 20 connects to the circuit board of the antenna unit 300 through the coaxial connector 26, so that the loss of a radio frequency signal between the duplexer 20 and the antenna unit 300 is reduced.

The antenna unit 300 may be a directional antenna or an omni-directional antenna. The antenna radiation unit 80 may be an array antenna or a patch antenna. The embodiment of the present invention is not thus limited.

It should be noted that the structure of the radio frequency unit 200 in the integrated antenna according to the embodiment may be consistent with the structure illustrated for the radio frequency unit according to the embodiment, and is not repeated here.

Referring to FIG. 6, the antenna unit 300 includes an antenna reflection board 70, an antenna radiation unit feeder circuit board 71 is positioned at the antenna reflection board 70, an antenna radiation unit 80 is positioned at the antenna radiation unit feeder circuit board 71, and the antenna radiation unit 80 connects to the antenna radiation unit feeder circuit board 71.

Still referring to FIG. 6, the circuit board is the antenna radiation unit feeder circuit board 71, and the duplexer 20 connects to the antenna radiation unit feeder circuit board 71 of the antenna unit 300 through the coaxial connector 26.

Figure 7:
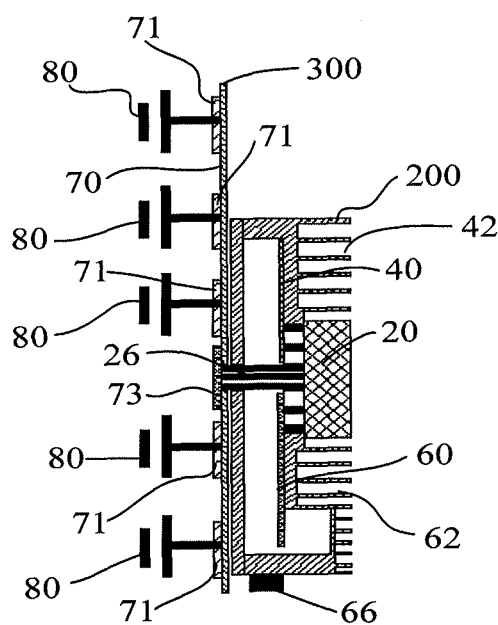
FIG. 7 is another schematic structural view of an integrated antenna according to an embodiment of the present invention.

Referring to FIG. 7, the antenna unit 300 includes an antenna reflection board 70, an antenna radiation unit feeder circuit board 71 is positioned at the antenna reflection board 70, an antenna radiation unit 80 is positioned at the antenna radiation unit feeder circuit board 71, the antenna radiation unit 80 connects to the antenna radiation unit feeder circuit board 71. The antenna unit 300 further includes a feeder network circuit board 73, and the feeder network circuit board 73 connects to the antenna radiation unit feeder circuit board 71.

Still referring to FIG. 7, the circuit board includes a feeder network circuit board 73 and an antenna radiation unit feeder circuit board 71, the antenna radiation unit feeder circuit board 71 connects to the feeder network circuit board 73, and the duplexer 20 connects to the feeder network circuit board 73 of the antenna unit 300 through the coaxial connector 26.

Figure 8:
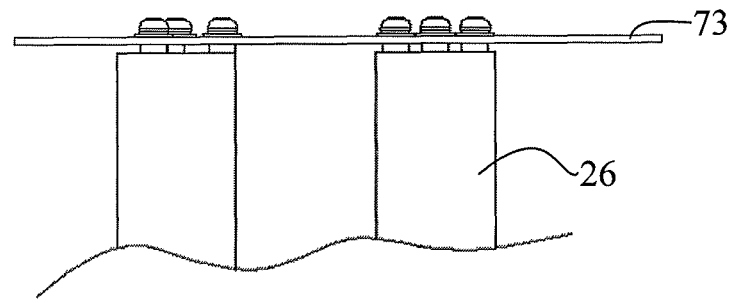
FIG. 8 is a schematic view in which a coaxial connector of a duplexer connects to a feeder network circuit board in an integrated antenna according to an embodiment of the present invention.
Figure 9:
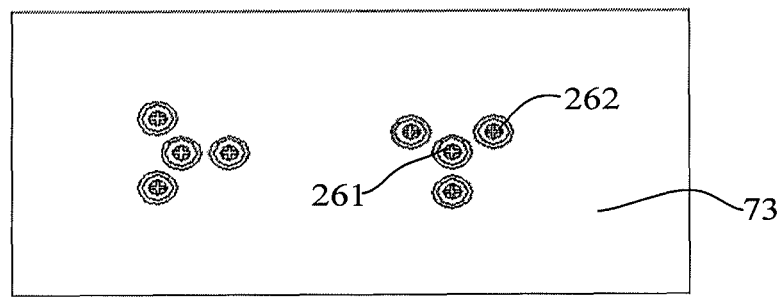
FIG. 9 is a schematic view in which a coaxial connector of a duplexer connects to a feeder network circuit board in an integrated antenna according to an embodiment of the present invention.

Referring to FIGS. 8 and 9, schematic views in which the duplexer 20 in FIG. 7 connects to the feeder network circuit board 73 through the coaxial connector 26 are shown. An internal conductor 261 of the coaxial connector 26 may connect to the feeder network circuit board 73 through screws, and an external conductor 262 of the coaxial connector may connect to the feeder network circuit board 73 through screws. It should be understood that the coaxial connector 26 may also connect to the feeder network circuit board 73 in a welding manner, but the embodiment of the present invention is not limited thereto. Definitely, the coaxial connector 26 may also connect to the antenna radiation unit feeder circuit board 71.

Figure 10:
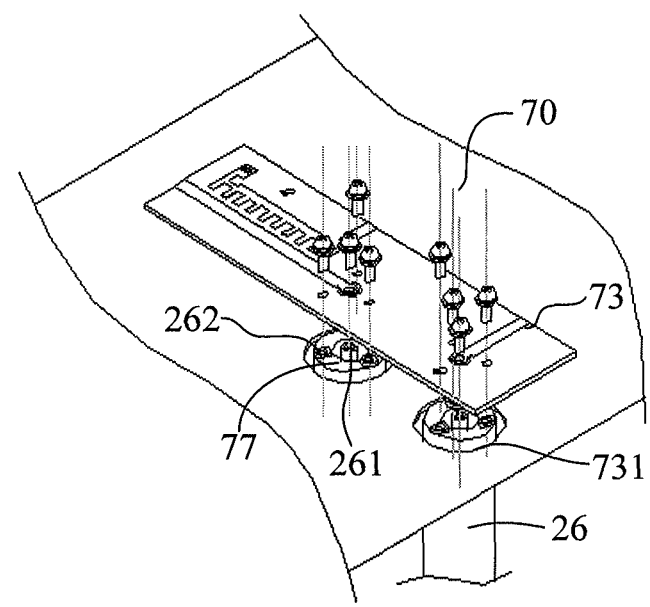
FIG. 10 is a schematic view in which a coaxial connector of a duplexer connects to a feeder network circuit board in an integrated antenna according to an embodiment of the present invention.

Referring to FIG. 10, a hole 731 is opened on the reflection board 73, the coaxial connector 26 is sleeved in the hole 731, and an insulating portion is disposed between the external conductor 262 of the coaxial connector 26 and a peripheral side of the hole 731 of the reflection board 73. Thus, electromagnetic induction between the external conductor 262 of the coaxial connector and the reflection board 73 is prevented, so as to avoid affecting an electromagnetic wave radiation performance of the antenna radiation unit 80.

A boss 77 is positioned at the coaxial connector 26, the external conductor 262 of the coaxial connector 26 is separated from the reflection board 70 through the boss 77, and the insulating portion is the boss 77. The insulating portion may also be an insulating spacer, and the external conductor 262 of the coaxial connector 26 is separated from the reflection board 70 through the insulating spacer.

Further, referring to FIGS. 6 and 7, a set of heat sink teeth 42 are positioned at one side of the power amplifier circuit board 40, another set of heat sink teeth 62 are positioned at one side of the transceiver circuit board 60, and the heat generated by the power amplifier circuit board 40 and the transceiver circuit board 60 is dissipated through the heat sink teeth 42 and the heat sink teeth 62.

Figure 11:
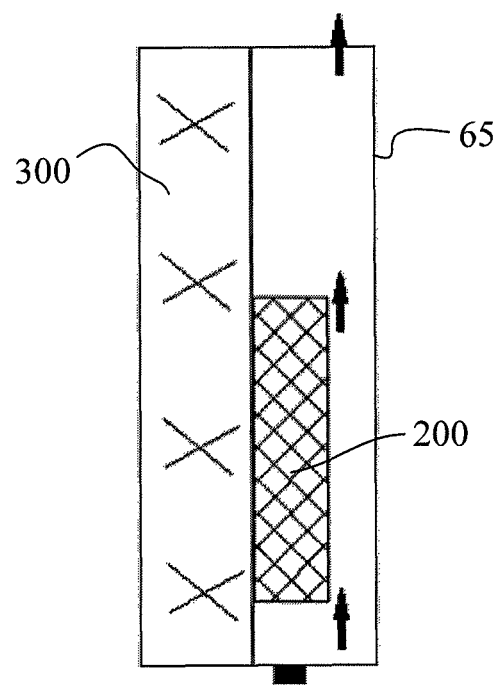
FIG. 11 is a schematic structural view in which an integrated antenna includes a sun shade according to an embodiment of the present invention.

Referring to FIG. 11, in an integrated antenna according to an embodiment of the present invention, a sun shade 65 is further positioned at the radio frequency unit 200, so that the sun shade 65 may not only shade the irradiation of the sun, but also form a chimney effect to dissipate the heat of the radio frequency unit 200, where an air flow direction is as shown in FIG. 10, thereby facilitating the heat dissipation of the radio frequency unit 200. The sun shade 65 may be fixed on the radio frequency unit 200 through screws.

The above descriptions are merely several embodiments of the present invention, but not intended to limit the present invention. Any modification, equivalent replacement, and improvement made without departing from the spirit and principle of the present invention fall within the scope of the present invention.

What is claimed is:

1. A radio frequency unit, comprising:
a duplexer,
a power amplifier circuit board, and
a transceiver circuit board, the duplexer being connected to the power amplifier circuit board and the transceiver circuit board, the power amplifier circuit board being connected to the transceiver circuit board, wherein the power amplifier circuit board and the transceiver circuit board are respectively located at two opposite ends of the duplexer, and the power amplifier circuit board and the transceiver circuit board are respectively located at opposite sides of the duplexer, wherein the radio frequency unit is configured to communicate with a plurality of mobile terminals.

2. The radio frequency unit according to claim 1, wherein, when the duplexer is in a working position with an upper end and a lower end, the power amplifier circuit board is located at the upper end of the duplexer, and the transceiver circuit board is located at the lower end of the duplexer.

3. The radio frequency unit according to claim 1, further comprising a hybrid connector, wherein the transceiver circuit board is connected with a baseband processing unit and a power equipment via the hybrid connector.

4. The radio frequency unit according to claim 1, wherein a heat sink is positioned at a side of the power amplifier circuit board, and the power amplifier circuit board and the transceiver circuit board are positioned at the same side of the fin base of the heat sink.

5. The radio frequency unit according to claim 1, wherein the duplexer is connected to the power amplifier circuit board via one of the following means: a screw, a cap, a radio frequency connector, a coaxial cable, and a blinding-mating connector.

6. The radio frequency unit according to claim 1, wherein the duplexer is connected to the transceiver circuit board via one of the following means: a screw, a cap, a radio frequency connector, a coaxial cable, and a blinding-mating connector.

7. The radio frequency unit according to claim 1, wherein the power amplifier circuit board is connected to the transceiver circuit board via one of the following means: a hybrid connector, a radio frequency connector, and a coaxial cable.

8. An integrated antenna, comprising: an antenna unit, and a radio frequency unit, wherein the radio frequency unit comprises:
   a duplexer,
   a power amplifier circuit board, and
   a transceiver circuit board, the duplexer being connected to the power amplifier circuit board and the transceiver circuit board, the power amplifier circuit board being connected to the transceiver circuit board, and the duplexer being connected to the antenna unit via a coaxial connector, wherein the power amplifier circuit board and the transceiver circuit board are respectively located at two opposite ends of the duplexer, and the power amplifier circuit board and the transceiver circuit board are respectively located at opposite sides of the duplexer, wherein the radio frequency unit is configured to communicate with a plurality of mobile terminals.

9. The integrated antenna according to claim 8, wherein the antenna unit comprises a reflection board having a hole, the coaxial connector is sleeved in the hole, and an insulating portion is disposed between an external conductor of the coaxial connector and a peripheral side of the hole of the reflection board.

10. The integrated antenna according to claim 8, wherein the antenna unit comprises an antenna radiation unit feeder circuit board.

11. The integrated antenna according to claim 8, wherein the antenna unit comprises a feeder network circuit board and an antenna radiation unit feeder circuit board, the feeder network circuit board being connected to the antenna radiation unit feeder circuit board, and the duplexer being connected to the feeder network circuit board of the antenna unit via the coaxial connector.

12. The integrated antenna according to claim 8, wherein a heat sink is positioned at a side of the power amplifier circuit board, and the power amplifier circuit board and the transceiver circuit board are positioned at the same side of the fin base of the heat sink.

13. The integrated antenna according to claim 8, further comprising a sun shade positioned at the radio frequency unit.

14. The integrated antenna according to claim 8, wherein, when the duplexer is in a working position with an upper end and a lower end, the power amplifier circuit board is located at the upper end of the duplexer, and the transceiver circuit board is located at the lower end of the duplexer.

15. The integrated antenna according to claim 8, wherein the duplexer is connected to the power amplifier circuit board via one of the following means: a screw, a cap, a radio frequency connector, a coaxial cable, and a blinding-mating connector.

16. The integrated antenna according to claim 8, wherein the duplexer is connected to the transceiver circuit board via one of the following means: a screw, a cap, a radio frequency connector, a coaxial cable, and a blinding-mating connector.

17. The integrated antenna according to claim 8, wherein the power amplifier circuit board is connected to the transceiver circuit board via one of the following means: a hybrid connector, a radio frequency connector, and a coaxial cable.

18. The integrated antenna according to claim 9, wherein the insulating portion is a boss positioned at the coaxial connector, and the external conductor of the coaxial connector is separated from the peripheral side of the hole of the reflection board via the boss.

19. The integrated antenna according to claim 9, wherein the insulating portion is an insulating spacer, and the external conductor of the coaxial connector is separated from the peripheral side of the hole of the reflection board via the insulating spacer.

20. A system, comprising: an integrated antenna and a baseband processing unit,
   wherein the integrated antenna comprises an antenna unit, and a radio frequency unit,
   wherein the radio frequency unit comprises a duplexer, a power amplifier circuit board, and a transceiver circuit board, the duplexer being connected to the power amplifier circuit board and the transceiver circuit board, the power amplifier circuit board being connected to the transceiver circuit board, and the duplexer being connected to the antenna unit via a coaxial connector,
   wherein the power amplifier circuit board and the transceiver circuit board are respectively located at two opposite ends of the duplexer, and the power amplifier circuit board and the transceiver circuit board are respectively located at opposite sides of the duplexer, and
   wherein the transceiver circuit board is connected to the baseband processing unit, and the baseband processing unit is connected with a transmission equipment and a power equipment, wherein the radio frequency unit is configured to communicate with a plurality of mobile terminals.

* * * * *